(12) United States Patent
Huang et al.

(10) Patent No.: US 12,586,623 B2
(45) Date of Patent: Mar. 24, 2026

(54) PULSE SIGNAL GENERATOR SYSTEM FOR A MAGNETORESISTIVE RANDOM ACCESS MEMORY ARRAY

(71) Applicant: UNITED MICROELECTRONICS CORP., Hsin-Chu City (TW)

(72) Inventors: Cheng-Tung Huang, Kaohsiung City (TW); Ting-Hao Chang, Kaohsiung City (TW); Chien-Yu Ko, Tainan City (TW); Wen-Liang Huang, Taoyuan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 98 days.

(21) Appl. No.: 18/789,717

(22) Filed: Jul. 31, 2024

(65) Prior Publication Data

US 2026/0018201 A1 Jan. 15, 2026

(30) Foreign Application Priority Data

Jul. 12, 2024 (TW) ................................. 113126218

(51) Int. Cl.
G11C 16/04 (2006.01)
G11C 11/16 (2006.01)
(52) U.S. Cl.
CPC ...... G11C 11/1693 (2013.01); G11C 11/1697 (2013.01)
(58) Field of Classification Search
CPC ........................ G11C 11/1693; G11C 11/1697
See application file for complete search history.

(56) References Cited

U.S. PATENT DOCUMENTS

| | | | |
|---|---|---|---|
| 9,741,455 B1 | 8/2017 | Park | |
| 11,335,387 B2 * | 5/2022 | Shan | G11C 8/08 |
| 2003/0179612 A1 * | 9/2003 | Lovett | G11C 7/22 |
| | | | 365/194 |
| 2008/0151656 A1 | 6/2008 | Nakai | |
| 2016/0352350 A1 | 12/2016 | Tanizawa | |
| 2018/0039532 A1 | 2/2018 | Kim | |
| 2025/0374554 A1 * | 12/2025 | Chang | H10B 61/22 |

FOREIGN PATENT DOCUMENTS

| | | |
|---|---|---|
| TW | I427906 | 2/2014 |
| WO | 2017176217 A1 | 10/2017 |

* cited by examiner

*Primary Examiner* — Pho M Luu
(74) *Attorney, Agent, or Firm* — Winston Hsu

(57) ABSTRACT

A pulse signal generator system for a magnetoresistive random access memory includes a delay chain circuit, a NAND gate, an amplitude tunable inverter, and a memory array. The delay chain circuit is used to receive an input signal and generate a delayed output signal. The NAND gate is coupled to the delay chain circuit. The NAND gate includes a first input terminal for receiving the input signal, a second input terminal for receiving the delayed output signal, and an output terminal for outputting a first pulse signal. The amplitude tunable inverter is coupled to the NAND gate. The amplitude tunable inverter includes an input terminal for receiving the first pulse signal, and an output terminal for outputting a second pulse signal. The memory array is coupled to the amplitude tunable inverter.

14 Claims, 9 Drawing Sheets

PULSE SIGNAL GENERATOR SYSTEM FOR A MAGNETORESISTIVE RANDOM ACCESS MEMORY ARRAY

BACKGROUND OF THE INVENTION

1. Field of the Invention

The present invention relates to a pulse signal generator system for a magnetoresistive random access memory array, and more particularly, a pulse signal generator system capable of generating a pulse signal having user-defined pulse width and user-defined pulse amplitude.

2. Description of the Prior Art

Magnetoresistive random access memory (MRAM) is a new type of non-volatile memory (NVM) composed of a large number of magnetic tunnel junctions (MTJs). An MTJ is a three-layer structure composed of two ferromagnetic layers sandwiching an insulating layer. The resistance of the MTJ changes depending on the relative orientation of the magnetization of the two ferromagnetic layers. The MRAM has several advantages, including non-volatility, high operational speed, high endurance, and low power consumption, which make it a promising candidate for applications in a flash memory, a dynamic random-access memory, and a static random-access memory. Further, read/write operations of the MTJ can be performed according to its resistance.

Conventional method of testing the MRAM requires an MTJ data source. The MTJ data source requires to generate very short pulse signals (i.e., pulse width<500 μs) to the memory array. This may lead to high cost and throughput bottlenecks for the MTJ data source. Alternatively, additional tools, interfaces, and hardware components may be required to assisting testing operations of the MTJ data source.

Therefore, developing a pulse signal generation system having high operational flexibility and low complexity for testing various MRAMs is an important design issue.

SUMMARY OF THE INVENTION

In an embodiment of the present invention, a pulse signal generator system for a magnetoresistive random access memory array is disclosed. The pulse signal generator system comprises a delay chain circuit, a NAND gate, an amplitude tunable inverter, and a memory array. The delay chain circuit is configured to receive an input signal and generate a delayed output signal. The NAND gate is coupled to the delay chain circuit. The NAND gate comprises a first input terminal configured to receive the input signal, a second input terminal configured to receive the delayed output signal, and an output terminal configured to output a first pulse signal. The amplitude tunable inverter is coupled to the NAND gate. The amplitude tunable inverter comprises an input terminal configured to receive the first pulse signal, and an output terminal configured to output a second pulse signal. The memory array is coupled to the amplitude tunable inverter. The memory array comprises a plurality of memory cells each being controlled according to the second pulse signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
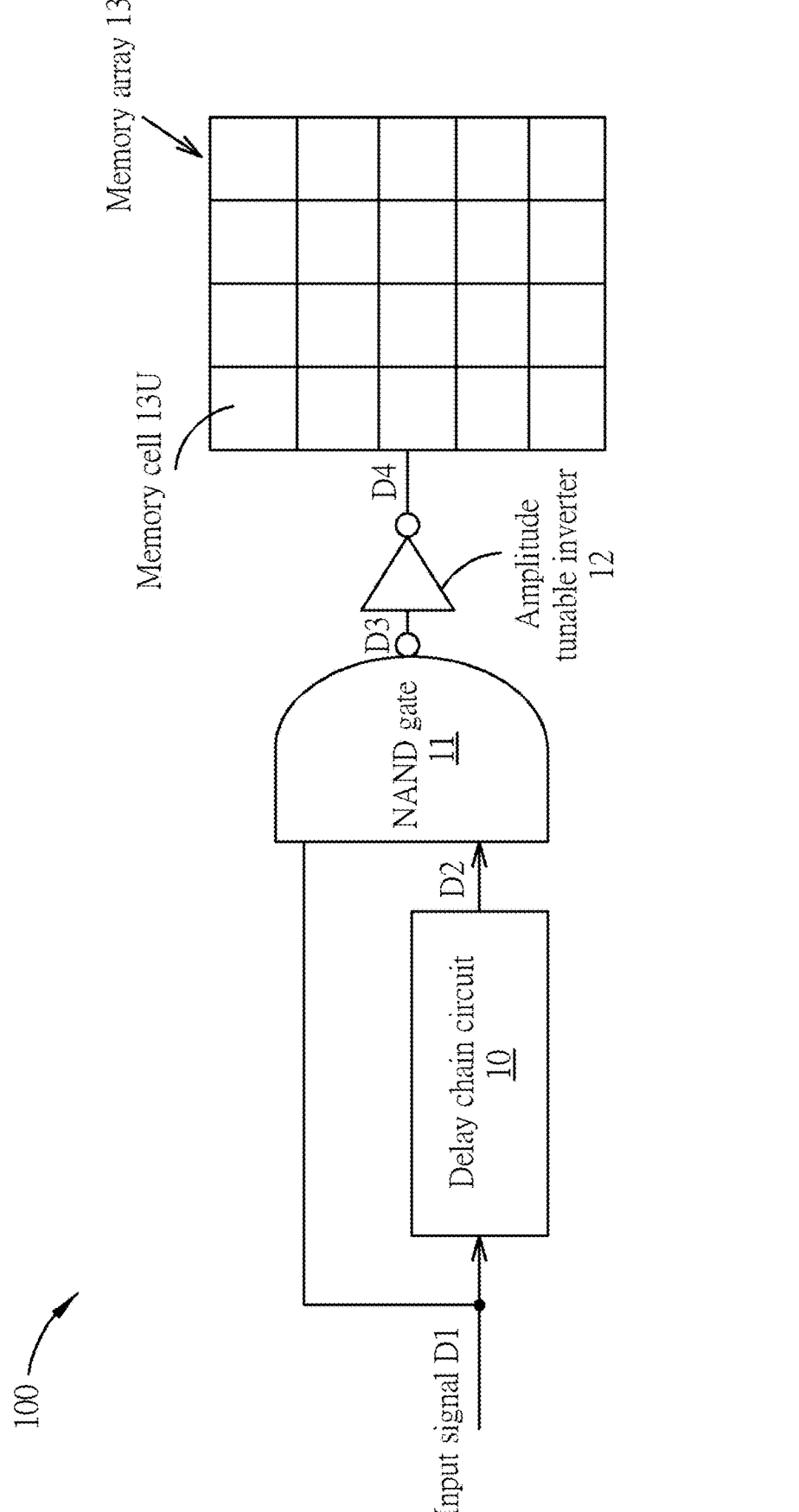
FIG. 1 is a block diagram of a pulse signal generator system for a magnetoresistive random access memory array according to an embodiment of the present invention.

FIG. 1 is a block diagram of a pulse signal generator system 100 for a magnetoresistive random access memory (MRAM) array according to an embodiment of the present invention. For presentation simplicity, it is called as the pulse signal generator system 100 hereafter. The pulse signal generator system 100 can be used for generating pulse signals having various user-defined pulse widths and amplitudes. Therefore, it can be applied to different applications of testing read/write channels of various MRAM arrays. As shown in FIG. 1, the pulse signal generator system 100 includes a delay chain circuit 10, a NAND gate 11, an amplitude tunable inverter 12, and a memory array 13. The delay chain circuit 10 is used for receiving an input signal D1 to generate a delayed output signal D2. The NAND gate 11 is coupled to the delay chain circuit 10. The NAND gate 11 includes a first input terminal for receiving the input signal D1, a second input terminal for receiving the delayed output signal D2, and an output terminal for outputting a first pulse signal D3. The amplitude tunable inverter 12 is coupled to the NAND gate 11. The amplitude tunable inverter 12 includes an input terminal for receiving the first pulse signal D1, and an output terminal for outputting a second pulse signal D4. The memory array 13 is coupled to the amplitude tunable inverter 12. The memory array 13 includes a plurality of memory cells 13U. Each memory cell 13U is controlled according to the second pulse signal D4. It should be understood that the memory array 13 can be an MRAM array. The structure of the MRAM array is composed of many magnetic tunnel junctions (MTJs). Further, the second pulse signal D4 can be used for controlling at least one memory cell 13U in the memory array 13 through a multiplexer or a selector. Any reasonable technology or hardware modification of the pulse signal generator system 100 falls into the scope of the present invention.

Figure 2:
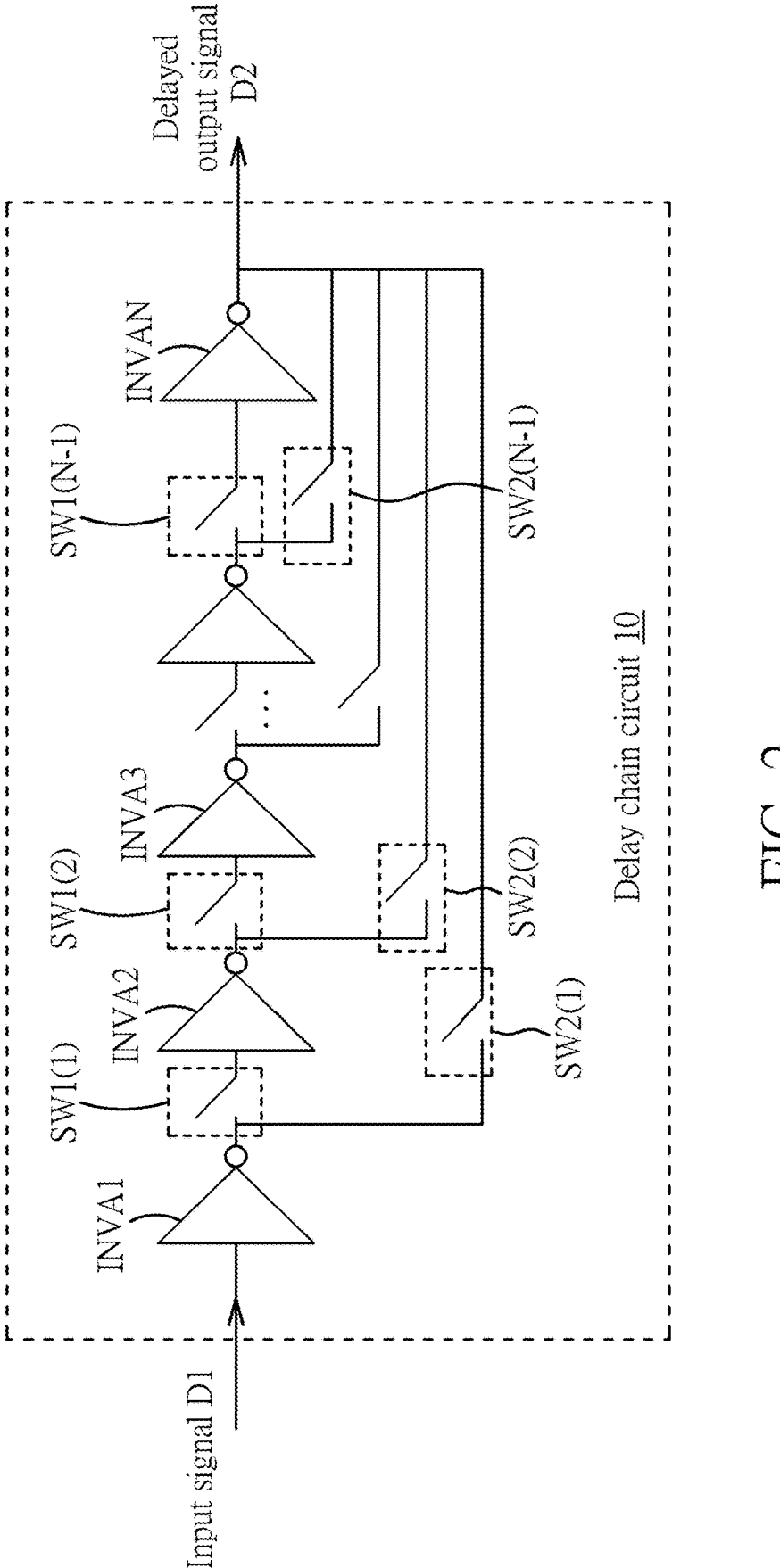
FIG. 2 is an illustration of a delay chain circuit of the pulse signal generator system in FIG. 1.

FIG. 2 is an illustration of the delay chain circuit 10 of the pulse signal generator system 100. The delay chain circuit 10 includes a plurality of first inverters INVA1 to INVAN, a plurality of first switches SW1(1) to SW1(N−1), and a plurality of second switches SW2(1) to SW2(N−1). For the plurality of first inverters INVA1 to INVAN, two adjacent first inverters are coupled in series through a first switch. For example, the first inverter INVA1 is coupled in series with the first inverter INVA2 through the first switch SW1(1). The first inverter INVA2 is coupled in series with the first inverter INVA3 through the first switch SW1(2), and so on. The plurality of second switches SW2(1) to SW2(N−1) are coupled to the first inverters INVA1 to INVAN and the second input terminal of the NAND gate 11 for controlling conduction states and cut-off states between the plurality of first inverters INVA1 to INVAN and the second input terminal of the NAND gate 11. For example, the second switch SW2(1) is used for controlling the conduction state and cut-off state between the output terminal of the first inverter INVA1 and the second input terminal of the NAND gate 11. The second switch SW2(2) is used for controlling the conduction state and cut-off state between the output terminal of first inverter INVA2 and the second input terminal of the NAND gate 11, and so on. In FIG. 2, the delay chain circuit 10 includes N first inverters INVA1 to INVAN, N−1 first switches SW1(1) to SW1(N−1), and N−1 second switches SW2(1) to SW2(N−1). N can be an odd number. The first inverters INVA1 to INVAN are used for converting an input signal D1 into a delayed output signal D2. However, in other embodiments, N can also be an even number. Any reasonable design of N falls into the scope of the present invention. In the pulse signal generator system 100, the input signal D1 can include a rising edge and/or a falling edge. For example, a waveform of the input signal D1 can be a square wave. After the input signal D1 is received by delay chain circuit 10, when an odd number of first inverters are enabled by using the first switches SW1(1) to SW1(N−1) and the second switches SW2(1) to SW2(N−1), a phase of the input signal D1 and a phase of the delayed output signal D2 are complementary. In other words, the delayed output signal D2 can be regarded as the "delayed" and "inverted" input signal D1.

Figure 3:
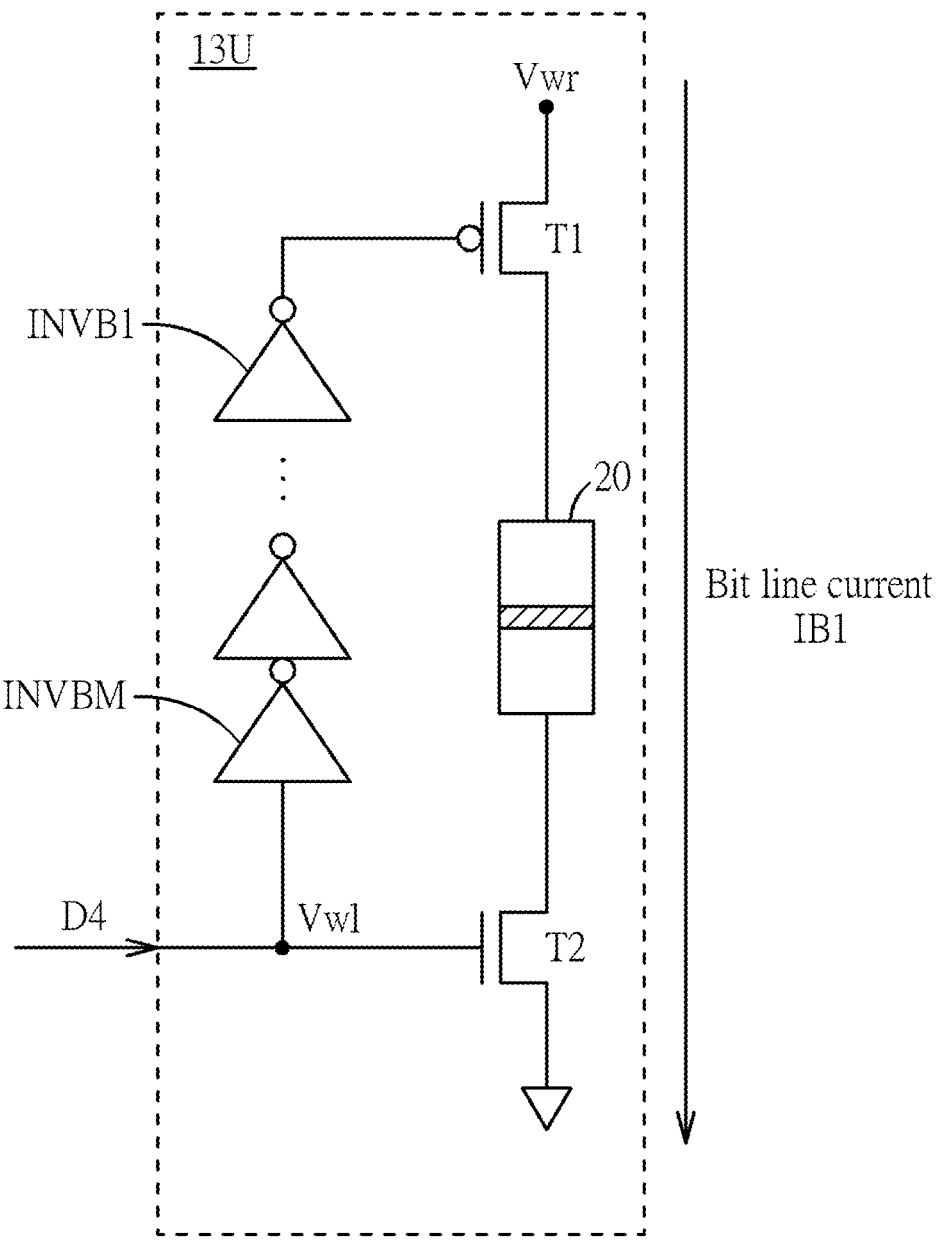
FIG. 3 is a first circuit structure of a memory cell of the pulse signal generator system in FIG. 1.

FIG. 3 is a first circuit structure of a memory cell 13U of the pulse signal generator system 100. As previously mentioned, the memory cell 13U can be a magnetic tunnel junction (MTJ) memory cell. The memory cell 13U can include a first transistor T1, an MTJ component 20, a second transistor T2, and at least one second inverter INVB1 to INVBM. The first transistor T1 includes a first terminal for receiving a bit line voltage Vwr, a second terminal, and a control terminal. The MTJ component 20 includes a first terminal coupled to the second terminal of the first transistor T1, and a second terminal. The second transistor T2 includes a first terminal coupled to the second terminal of the MTJ component 20, a second terminal coupled to the ground terminal, and a control terminal coupled to the output terminal of the amplitude tunable inverter 12 for receiving the second pulse signal D4. At least one second inverter INVB1 to INVBM is coupled in series between the control terminal of the second transistor T2 and the control terminal of the first transistor T1. Mis a positive integer. Further, the first transistor T1 can be a P-type metal-oxide-semiconductor field-effect transistor (P-MOS). The second transistor T2 can be an N-type metal-oxide-semiconductor field-effect transistor (N-MOS). It should be understood that the MTJ component 20 is a three-layer structure composed of two ferromagnetic layers sandwiching an insulating layer. Its resistance changes with the relative direction of magnetization of the two ferromagnetic layers. Particularly, the read/write operations of the MTJ can be performed according to its resistance. In FIG. 3, when the first transistor T1 and the second transistor T2 are turned on, a bit line current IB1 is transmitted from the first transistor T1 to the second transistor T2 through the MTJ component 20. In other words, the pulse width (i.e., a high voltage duration) of the second pulse signal D4 determines a time length of turning on the first transistor T1 and the second transistor T2. The pulse amplitude of the second pulse signal D4 determines a magnitude of the bit line current IB1 transmitted from the first transistor T1 to the second transistor T2. Adjustments of the pulse width and the pulse amplitude of the second pulse signal D4 are illustrated later.

Figure 4:
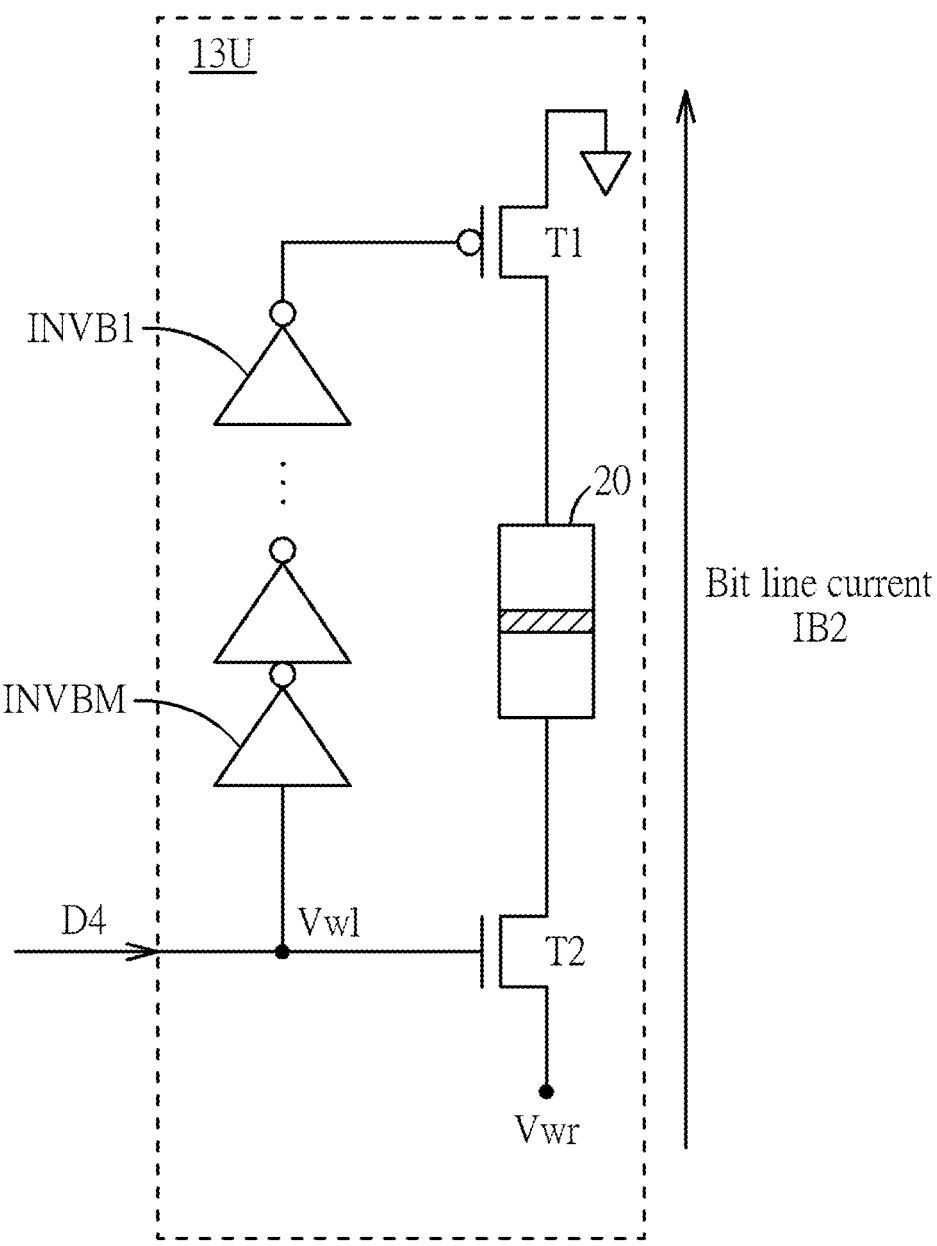
FIG. 4 is a second circuit structure of the memory cell of the pulse signal generator system in FIG. 1.

FIG. 4 is a second circuit structure of the memory cell 13U of the pulse signal generator system 100. In FIG. 4, the memory cell 13U can include the first transistor T1, the MTJ component 20, the second transistor T2, and the at least one second inverter INVB1 to INVBM. Specifically, since the circuit structure of the memory cell 13U in FIG. 4 is similar to the circuit structure of the memory cell 13U in FIG. 3, all component symbols are reused. A difference between FIG. 4 and FIG. 3 lies in that the first terminal of the first transistor T1 is coupled to the ground terminal. The second terminal of the second transistor T2 is used for receiving the bit line voltage Vwr. Therefore, in FIG. 4, when the first transistor T1 and the second transistor T2 are turned on, the bit line current IB2 is transmitted from the second transistor T2 to the first transistor T1 through the MTJ component 20. Similarly, the pulse width (i.e., a high voltage duration) of the second pulse signal D4 determines a time length of turning on the first transistor T1 and the second transistor T2. The pulse amplitude of the second pulse signal D4 determines a magnitude of the bit line current IB2 transmitted from the second transistor T2 to the first transistor T1.

In the pulse signal generator system 100, as previously mentioned, the delayed output signal D2 can be regarded as the "delayed" and "inverted" input signal D1. The input signal D1 and the delayed output signal D2 are inputted to the NAND gate 11. Moreover, a truth table of the NAND gate 11 can be listed in Table T1.

TABLE T1

| input signal D1 | delayed output signal D2 | first pulse signal D3 |
|---|---|---|
| Low voltage | Low voltage | High voltage |
| Low voltage | High voltage | High voltage |
| High voltage | Low voltage | High voltage |
| High voltage | High voltage | Low voltage |

As shown in Table T1, when both the input signal D1 and the delayed output signal D2 are at a high voltage for a certain time period, the first pulse signal D3 is at a low voltage for the time period. Moreover, the amplitude tunable inverter 11 can be an inverting amplifier. After the first pulse signal D3 is received by the amplitude tunable inverter 11, the amplitude tunable inverter 11 adjusts its amplitude, inverts its phase, and then generates the output as the second pulse signal D4. Therefore, by using the amplitude tunable inverter 11, when both the input signal D1 and the delayed output signal D2 are at the high voltage for a certain time period, the second pulse signal D4 is at a high voltage for the time period. It should be understood that an overlap time length of high voltage states of the input signal D1 and the delayed output signal D2 can be adjusted according to a delay time of the delayed output signal D2. The delay time of the delayed output signal D2 can be adjusted according to the number of inverters turned on in the delay chain circuit 10. Therefore, in the pulse signal generator system 100, by adjusting the number of inverters in the delay chain circuit 10 that are turned on by the first switches and the second switches, the pulse width of the second pulse signal D4 can be user-defined. Moreover, the pulse amplitude of the second pulse signal D4 can also be adjusted by using the amplitude tunable inverter 11. Therefore, the pulse signal generator system 100 can generate pulse signals having user-defined pulse widths and amplitudes in a low-complexity manner.

Figure 5:
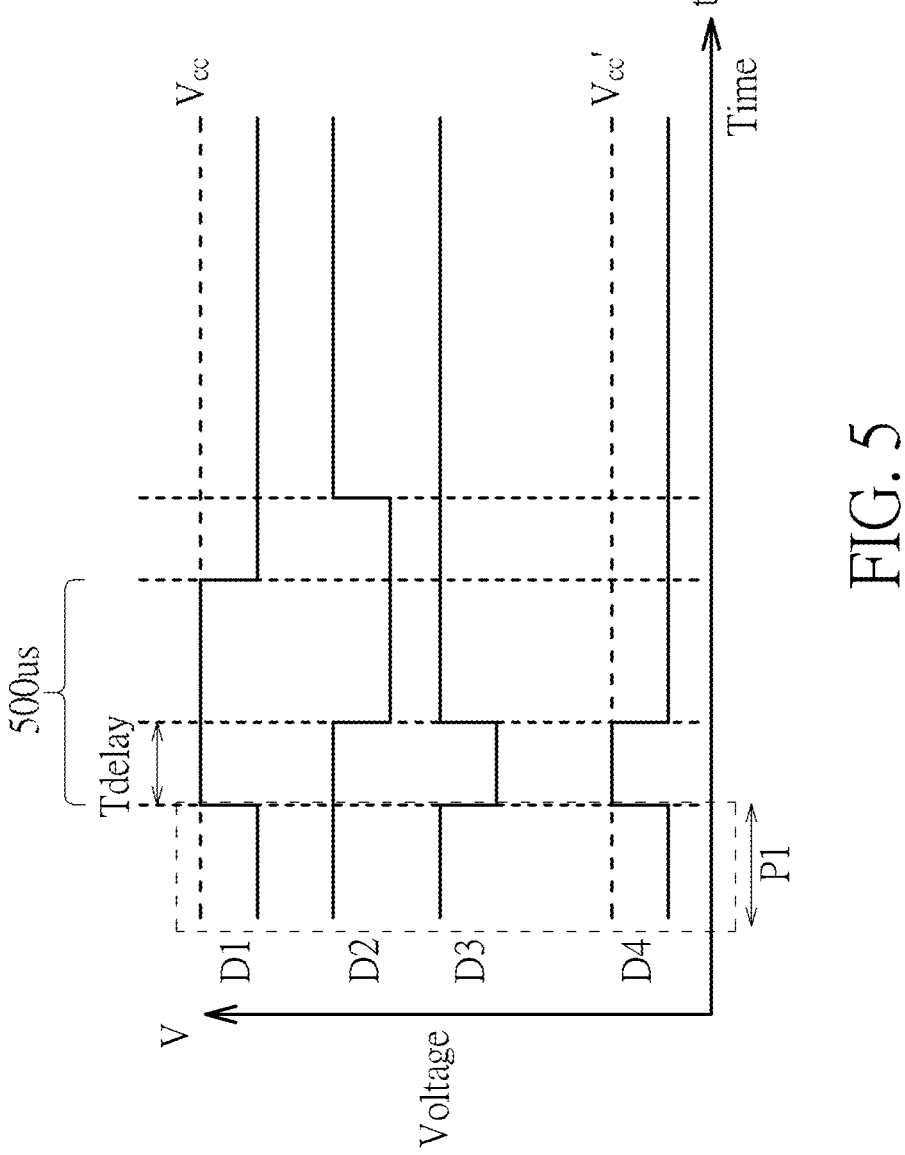
FIG. 5 is an illustration of waveforms of an input signal, a delayed output signal, a first pulse signal, and a second pulse signal under a first state of the pulse signal generator system in FIG. 1.

FIG. 5 is an illustration of waveforms of the input signal D1, the delayed output signal D2, the first pulse signal D3, and the second pulse signal D4 under a first state of the pulse signal generator system. X-axis is denoted as a time line. Y-axis is denoted as a voltage line. The input signal D1 is a square wave having a fixed width (i.e., 500 μs) and amplitude Vcc. The delayed output signal D2 can be regarded as an inverted waveform of the input signal D1 delayed by a time period Tdelay (say, a delay time Tdelay, hereafter). In the first time period P1, the input signal D1 is at a low voltage. The delayed output signal D2 is at a high voltage. According to the truth table of the NAND gate 11 (as shown in Table 1), the first pulse signal D3 is at a high voltage. The second pulse signal D4 is at a low voltage. Therefore, when phases of the input signal D1 and the delayed output signal D2 are different (i.e. low voltage and high voltage) during the first time period P1, the voltage of the second pulse signal D4 cannot be boosted during the first time period P1.

Figure 6:
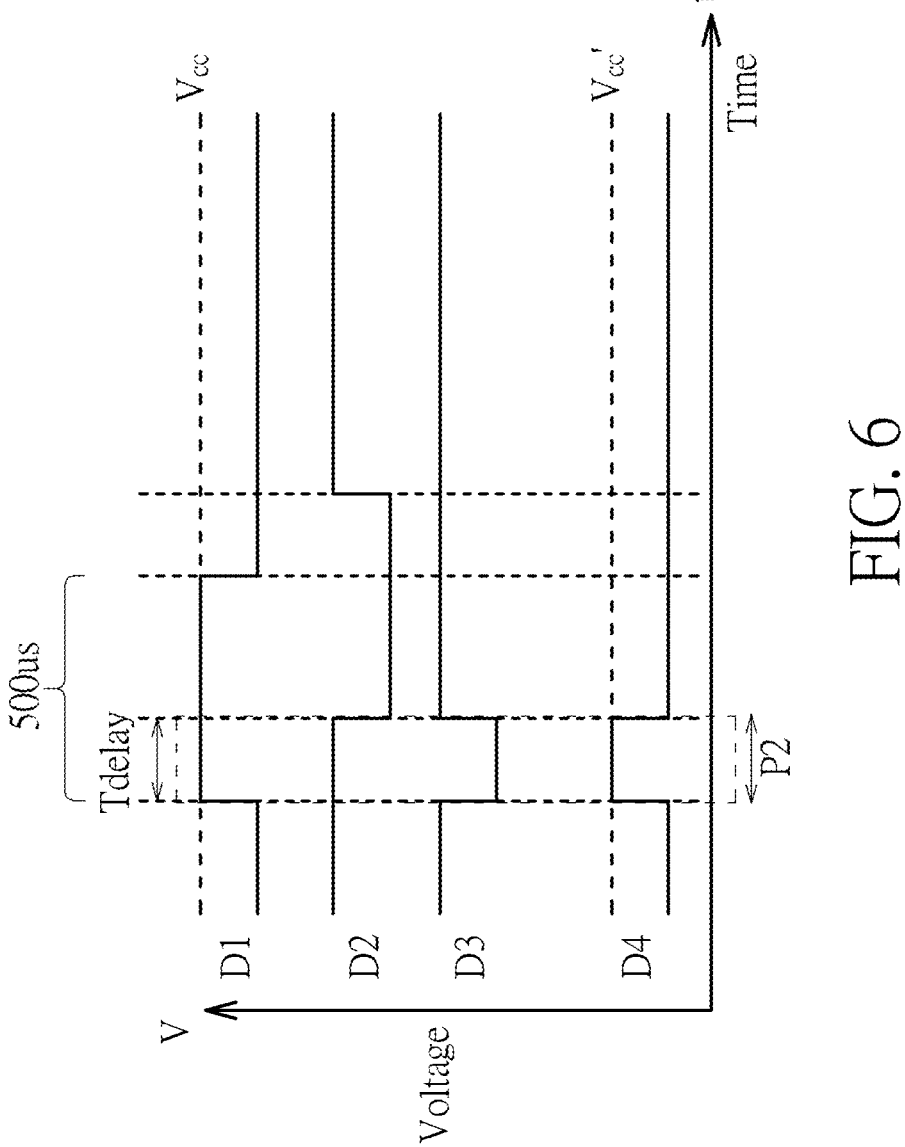
FIG. 6 is an illustration of waveforms of the input signal, the delayed output signal, the first pulse signal, and the second pulse signal under a second state of the pulse signal generator system in FIG. 1.

FIG. 6 is an illustration of waveforms of the input signal D1, the delayed output signal D2, the first pulse signal D3, and the second pulse signal D4 under a second state of the pulse signal generator system. X-axis is denoted as the time line. Y-axis is denoted as the voltage line. The input signal D1 is the square wave having the fixed width (i.e., 500 μs) and the amplitude Vcc. The delayed output signal D2 can be regarded as the inverted waveform of the input signal D1 delayed by the delay time Tdelay. In the second time period P2, the input signal D1 is at a high voltage. The delayed output signal D2 is at a high voltage. According to the truth table of the NAND gate 11 (as shown in Table 1), the first pulse signal D3 is at a low voltage. The second pulse signal D4 is at a high voltage. Its pulse amplitude can be adjusted as Vcc'. Therefore, when both the input signal D1 and the delayed output signal D2 are at the high voltages during the second time period P2, the voltage of the second pulse signal D4 can be boosted during the second time period P1.

Figure 7:
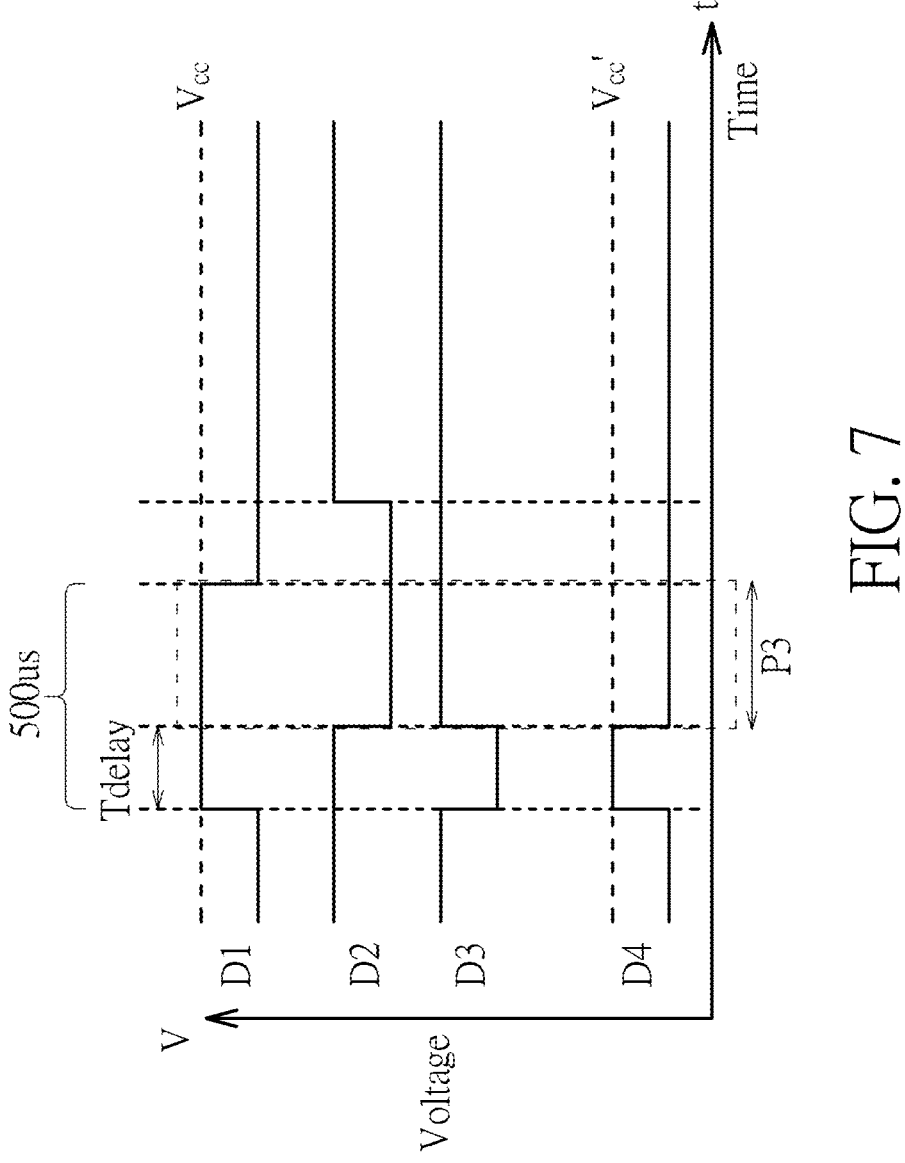
FIG. 7 is an illustration of waveforms of the input signal, the delayed output signal, the first pulse signal, and the second pulse signal under a third state of the pulse signal generator system in FIG. 1.

FIG. 7 is an illustration of waveforms of the input signal D1, the delayed output signal D2, the first pulse signal D3, and the second pulse signal D4 under a third state of the pulse signal generator system 100. X-axis is denoted as the time line. Y-axis is denoted as the voltage line. The input signal D1 is the square wave having the fixed width (i.e., 500 μs) and the amplitude Vcc. The delayed output signal D2 can be regarded as the inverted waveform of the input signal D1 delayed by the delay time Tdelay. In the third time period P3, the input signal D1 is at a high voltage. The delayed output signal D2 is at a low voltage. According to the truth table of the NAND gate 11 (as shown in Table 1), the first pulse signal D3 is at a high voltage. The second pulse signal D4 is at a low voltage. Therefore, when phases of the input signal D1 and the delayed output signal D2 are different (i.e. high voltage and low voltage) during the third time period P3, the voltage of the second pulse signal D4 cannot be boosted during the third time period P3.

Figure 8:
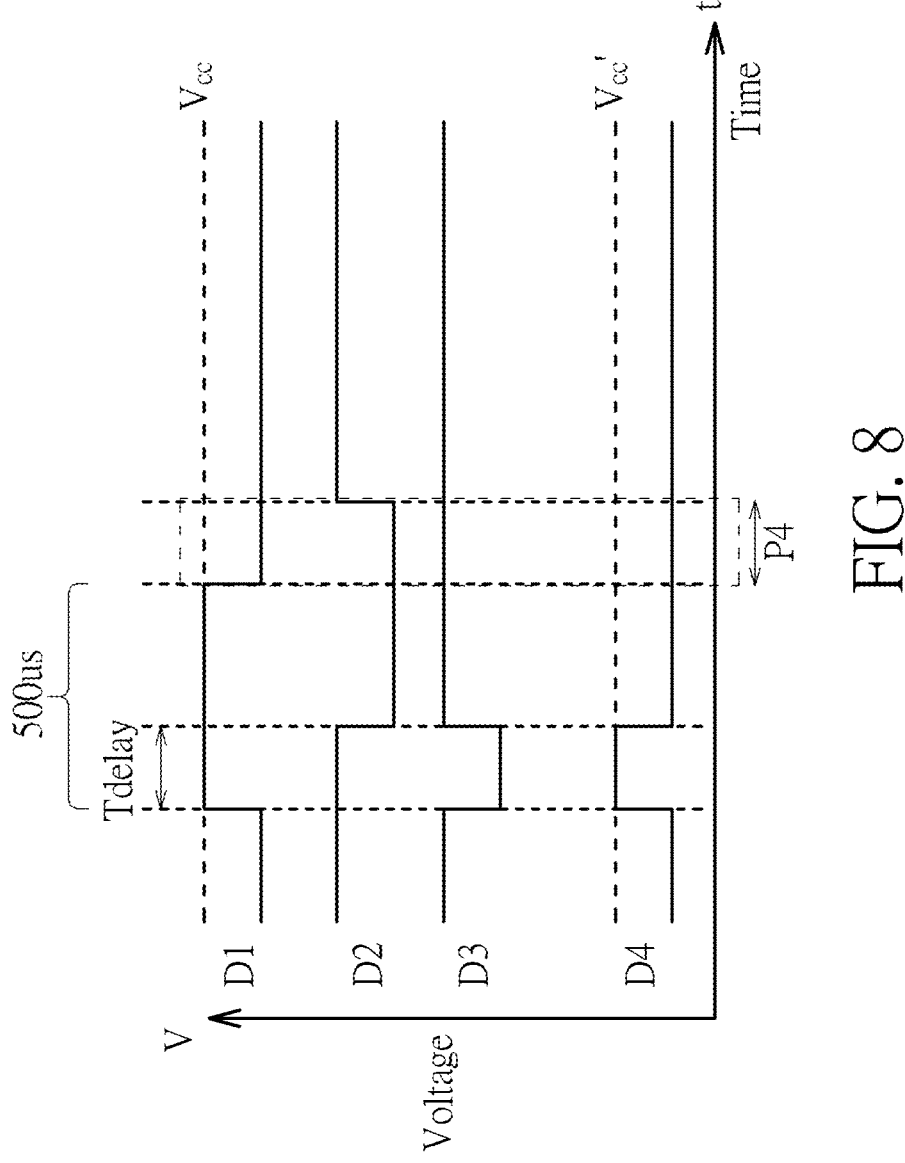
FIG. 8 is an illustration of waveforms of the input signal, the delayed output signal, the first pulse signal, and the second pulse signal under a fourth state of the pulse signal generator system in FIG. 1.

FIG. 8 is an illustration of waveforms of the input signal D1, the delayed output signal D2, the first pulse signal D3, and the second pulse signal D4 under a fourth state of the pulse signal generator system 100. X-axis is denoted as the time line. Y-axis is denoted as the voltage line. The input signal D1 is the square wave having the fixed width (i.e., 500 μs) and the amplitude Vcc. The delayed output signal D2 can be regarded as the inverted waveform of the input signal D1 delayed by the delay time Tdelay. In the fourth time period P4, the input signal D1 is at a low voltage. The delayed output signal D2 is at a low voltage. According to the truth table of the NAND gate 11 (as shown in Table 1), the first pulse signal D3 is at a high voltage. The second pulse signal D4 is at a low voltage. Therefore, when both the input signal D1 and the delayed output signal D2 are at the low voltages during the fourth time period P4, the voltage of the second pulse signal D4 cannot be boosted during the fourth time period P4.

As shown in FIG. 5 to FIG. 8, the delay time Tdelay is introduced between the input signal D1 and the delayed output signal D2. During the delay time Tdelay, both the input signal D1 and the output signal D2 are at high voltages. Therefore, a time period of the second pulse signal D4 being at a high voltage (say, "pulse width" of the second pulse signal D4) is equal to the delay time Tdelay. Therefore, in the pulse signal generator system 100, by adjusting the delay time Tdelay, the second pulse signal D4 having a pulse width equal to Tdelay can be generated.

Figure 9:
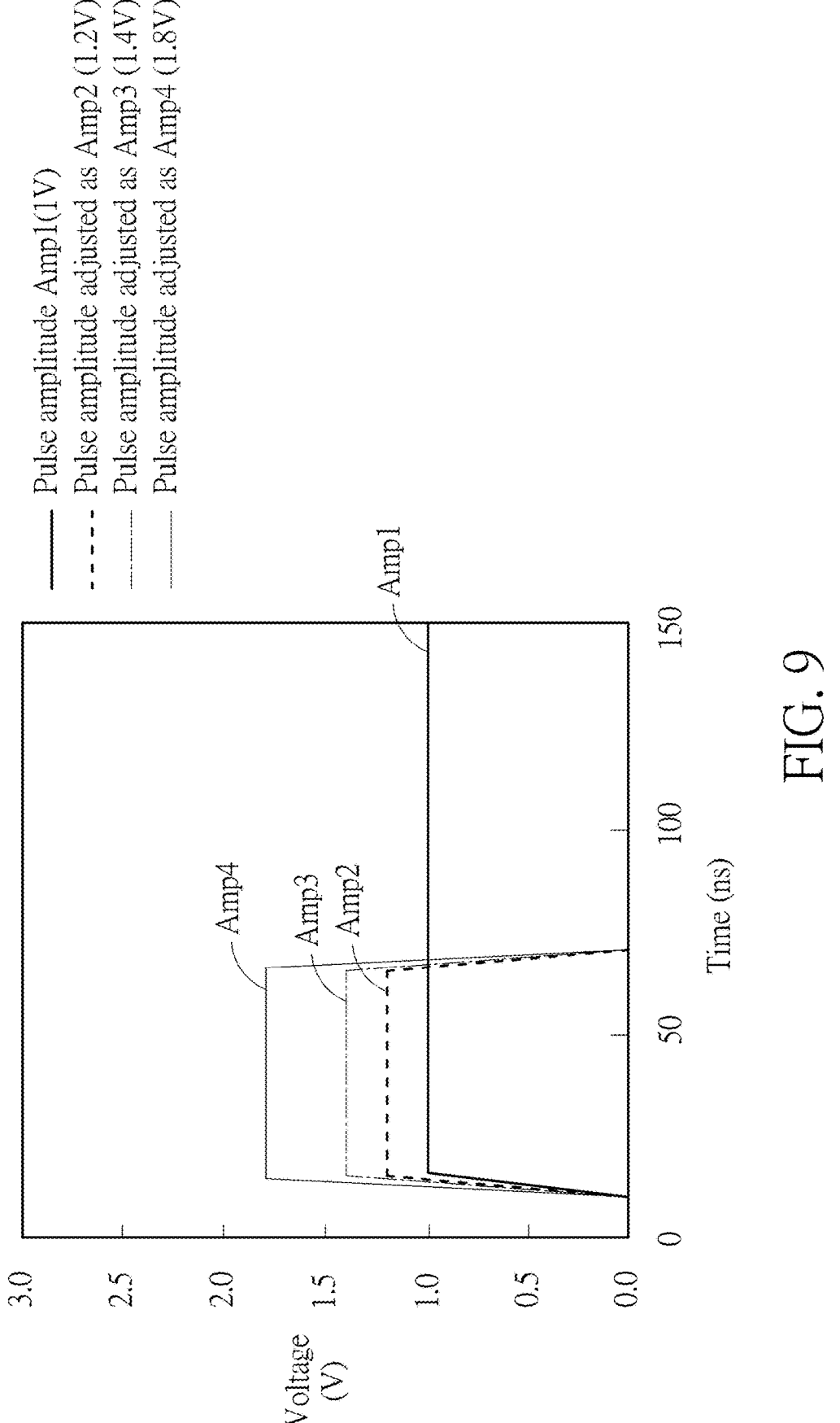
FIG. 9 is an illustration of waveforms of the input signal and second pulse signals having various amplitudes of the pulse signal generator system in FIG. 1.

FIG. 9 is an illustration of waveforms of the input signal D1 and second pulse signals D4 having various amplitudes of the pulse signal generator system 100. X-axis is denoted as the time line. Y-axis is denoted as the voltage line. As previously mentioned, in the pulse signal generator system 100, the pulse amplitude of the second pulse signal D4 can be adjusted by using the amplitude tunable inverter 12. For example, the pulse amplitude Amp1 of the input signal D1 is one volt (1V). After adjusting the pulse amplitude by using the amplitude tunable inverter 12, the pulse amplitude Amp2 of the second pulse signal D4 can be 1.2 volts (1.2V). In other embodiments, the pulse amplitude Amp3 of the second pulse signal D4 can be 1.4 volts (1.4V). The pulse amplitude Amp4 of the second pulse signal D4 can also be 1.8 volts (1.8V). In other words, in the embodiment of FIG. 9, the pulse amplitude of the second pulse signal D4 is between 1.2 volts and 1.8 volts. Further, an amplitude of the input signal D1 is smaller than an amplitude of the second pulse signal D4. However, the present invention is not limited thereto. In other embodiments, the pulse amplitude of the second pulse signal D4 can be adjusted to any voltage supported by the amplitude tunable inverter 12.

To sum up, the present invention discloses a pulse signal generator system for a magnetoresistive random access memory array. The pulse signal generator system introduces the delay chain circuit for delaying the input signal. Further, the pulse signal generator system introduces the NAND gate and the amplitude tunable inverter. After receiving the input signal and the delayed output signal by the NAND gate, the amplitude tunable inverter can output the pulse signal having user-defined pulse width and user-defined pulse amplitude. Moreover, in the pulse signal generator system, the pulse width of the output pulse signal can be determined according to the number of inverters in the delay chain circuit turned on by the first switches and the second switches. Furthermore, the pulse amplitude of the output pulse signal can also be adjusted according to a voltage gain of the amplitude tunable inverter. Therefore, the pulse signal generator system can generate pulse signals having user-defined pulse widths and amplitudes in the low-complexity manner.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pulse signal generator system for a magnetoresistive random access memory array comprising:

a delay chain circuit configured to receive an input signal and generate a delayed output signal;

a NAND gate coupled to the delay chain circuit, the NAND gate comprising:

a first input terminal configured to receive the input signal;

a second input terminal configured to receive the delayed output signal; and an output terminal configured to output a first pulse signal;

an amplitude tunable inverter coupled to the NAND gate, the amplitude tunable inverter comprising:

an input terminal configured to receive the first pulse signal; and an output terminal configured to output a second pulse signal; and a memory array coupled to the amplitude tunable inverter, the memory array comprising a plurality of memory cells each being controlled according to the second pulse signal.

2. The system of claim 1, wherein the delay chain circuit comprises:

a plurality of first inverters, wherein two adjacent first inverters of the plurality of first inverters are coupled in series through a first switch;

a plurality of second switches coupled to the plurality of first inverters and the second input terminal of the NAND gate, and configured to control conduction states and cut-off states between the plurality of first inverters and the second input terminal of the NAND gate;

wherein the plurality of first inverters are configured to convert the input signal to the delayed output signal.

3. The system of claim 2, wherein a plurality of first switches and the plurality of second switches are configured to enable odd number of first inverters of the plurality of first inverters so that a phase of the input signal and a phase of the delayed output signal are complementary.

4. The system of claim 1, wherein the input signal comprises a rising edge and/or a falling edge.

5. The system of claim 1, wherein each of the plurality of memory cells comprises:

a first transistor comprising:

a first terminal configured to receive a bit line voltage;

a second terminal; and a control terminal;

a magnetic tunnel junction component comprising:

a first terminal coupled to the second terminal of the first transistor; and a second terminal;

a second transistor comprising:

a first terminal coupled to the second terminal of the magnetic tunnel junction component;

a second terminal coupled to a ground terminal; and a control terminal coupled to the output terminal of the amplitude tunable inverter and configured to receive the second pulse signal; and at least one second inverter coupled in series between the control terminal of the second transistor and the control terminal of the first transistor.

6. The system of claim 5, wherein the first transistor is a P-type metal oxide semiconductor field effect transistor, the second transistor is an N-type metal oxide semiconductor field effect transistor, and when the first transistor and the second transistor are turned on, a bit line current is transmitted from the first transistor to the second transistor through the magnetic tunnel junction component.

7. The system of claim 1, wherein each of the plurality of memory cells comprises:

a first transistor comprising:

a first terminal coupled to a ground terminal;

a second terminal; and a control terminal;

a magnetic tunnel junction component comprising:

a first terminal coupled to the second terminal of the first transistor; and a second terminal;

a second transistor comprising:

a first terminal coupled to the second terminal of the magnetic tunnel junction component;

a second terminal configured to receive a bit line voltage; and a control terminal coupled to the output terminal of the amplitude tunable inverter and configured to receive the second pulse signal; and at least one second inverter coupled in series between the control terminal of the second transistor and the control terminal of the first transistor.

8. The system of claim 7, wherein the first transistor is a P-type metal oxide semiconductor field effect transistor, the second transistor is an N-type metal oxide semiconductor field effect transistor, and when the first transistor and the second transistor are turned on, a bit line current is transmitted from the second transistor to the first transistor through the magnetic tunnel junction component.

9. The system of claim 1, wherein when the input signal is at a high voltage and the delayed output signal is at a high voltage, the first pulse signal is at a low voltage and the second pulse signal is at a high voltage.

10. The system of claim 1, wherein when the input signal is at a high voltage and the delayed output signal is at a low voltage, the first pulse signal is at a high voltage and the second pulse signal is at a low voltage.

11. The system of claim 1, wherein when the input signal is at a low voltage and the delayed output signal is at a high voltage, the first pulse signal is at a high voltage and the second pulse signal is at a low voltage.

12. The system of claim 1, wherein when the input signal is at a low voltage and the delayed output signal is at a low voltage, the first pulse signal is at a high voltage and the second pulse signal is at a low voltage.

13. The system of claim 1, wherein the amplitude tunable inverter is an inverting amplifier, and the amplitude tunable inverter is configured to adjust an amplitude of the second pulse signal.

14. The system of claim 1, wherein a voltage of the second pulse signal is between 1.2 volts and 1.8 volts, and an amplitude of the input signal is smaller than an amplitude of the second pulse signal.

* * * * *